United States Patent
Guthrie et al.

(10) Patent No.: US 7,287,314 B2
(45) Date of Patent: Oct. 30, 2007

(54) ONE STEP COPPER DAMASCENE CMP PROCESS AND SLURRY

(75) Inventors: Hung-Chin Guthrie, Saratoga, CA (US); Ming Jiang, San Jose, CA (US); John Jaekoyun Yang, San Ramon, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 440 days.

(21) Appl. No.: 10/789,777

(22) Filed: Feb. 27, 2004

(65) Prior Publication Data

US 2005/0189319 A1 Sep. 1, 2005

(51) Int. Cl.
*G11B 5/17* (2006.01)
*H01L 21/461* (2006.01)

(52) U.S. Cl. ............... 29/603.25; 29/603.23; 29/603.12; 252/79.1; 438/691; 438/693

(58) Field of Classification Search ............. 29/603.25, 29/603.12, 603.23, 603.24, 603.27, 846, 29/DIG. 16, DIG. 19; 451/41; 51/307, 51/308, 309; 438/691, 693; 252/79.1, 79.2, 252/79.4; 216/52
See application file for complete search history.

(56) References Cited

U.S. PATENT DOCUMENTS

| | | | | |
|---|---|---|---|---|
| 5,954,997 A | * | 9/1999 | Kaufman et al. | 252/79.1 |
| 6,117,783 A | * | 9/2000 | Small et al. | 438/693 |
| 6,195,872 B1 | | 3/2001 | Sasaki | 29/603.13 |
| 6,226,149 B1 | | 5/2001 | Dill, Jr. et al. | 360/126 |
| 6,435,947 B2 | * | 8/2002 | Mueller et al. | 451/41 |
| 6,468,913 B1 | | 10/2002 | Pasqualoni et al. | 438/693 |
| 6,508,953 B1 | | 1/2003 | Li et al. | 252/79.1 |
| 6,510,022 B1 | | 1/2003 | Lahiri et al. | 360/126 |
| 6,554,878 B1 | | 4/2003 | Dill, Jr. et al. | 51/308 |
| 2002/0016275 A1 | | 2/2002 | Yano et al. | 510/254 |
| 2002/0191336 A1 | | 12/2002 | Hsiao et al. | 360/126 |
| 2003/0079416 A1 | | 5/2003 | Ma et al. | 51/307 |
| 2003/0104699 A1 | | 6/2003 | Minamihaba et al. | 438/692 |
| 2003/0104770 A1 | | 6/2003 | Pasqualoni et al. | 451/60 |
| 2003/0135986 A1 | | 7/2003 | Eschbach et al. | 29/603.12 |
| 2003/0184912 A1 | | 10/2003 | Hsiao et al. | 360/123 |

FOREIGN PATENT DOCUMENTS

| | | | |
|---|---|---|---|
| JP | 2001031953 | | 2/2001 |
| JP | 2003100678 | | 4/2003 |
| JP | 2003-313541 | * | 11/2003 |

OTHER PUBLICATIONS

Yoshimizu, H., et al., "Thin Film Magnetic Film Head Composed of Inorganic Materials," IEEE Transactions on Magnetics, vol. 28, No. 5, Sep. 1992.
"Alkaline Formulations for Chemical Mechanical Polishing of Copper Utilizing Azole Passivation", IBM Technical Disclosure Bulletin, Oct. 1994.
"Chemical-Mechanical Polishing of Copper with Ammonium Persulfate", IBM Technical Disclosure Bulletin, Oct. 1994.

* cited by examiner

*Primary Examiner*—A. Dexter Tugbang
(74) *Attorney, Agent, or Firm*—Zilka-Kotab, PC (57) ABSTRACT

A Chemical Mechanical Polish (CMP) process and slurry therefore slurry that is capable of removing NiFe, SiO2, Photoresist, Ta, alumina and Cu at substantially the same rate. The slurry is useful for obtaining a substantially planar surface of several materials while avoiding corrosion of Cu coil and NiFe structure.

1 Claim, 15 Drawing Sheets

ONE STEP COPPER DAMASCENE CMP PROCESS AND SLURRY

FIELD OF THE INVENTION

The present invention relates to a Chemical Mechanical Polishing process, and more particulary to the use of a Chemical Mechanical Polishing process in a Damascene manufacturing method that is useful for constructing structures such as magnetic write heads.

BACKGROUND OF THE INVENTION

Computer systems generally utilize auxiliary memory storage devices having media on which data can be written and from which data can be read for later use. A direct access storage device (DASD) such as a disk drive incorporating rotating magnetic disks is commonly used for storing data in magnetic form on the disk surfaces. Data is recorded on concentric, radially spaced tracks on the disk surfaces, and magnetic heads are used to write the data to and read the data from the tracks on the disk surfaces.

Data is written onto a disk by a write head that includes a magnetic yoke having a coil, passing there through. When current flows through the coil, a magnetic flux is induced in the yoke, which causes a magnetic field to fringe out at a write gap. It is this magnetic field that writes data, in the form of magnetic transitions, onto the disk.

Figure 1:
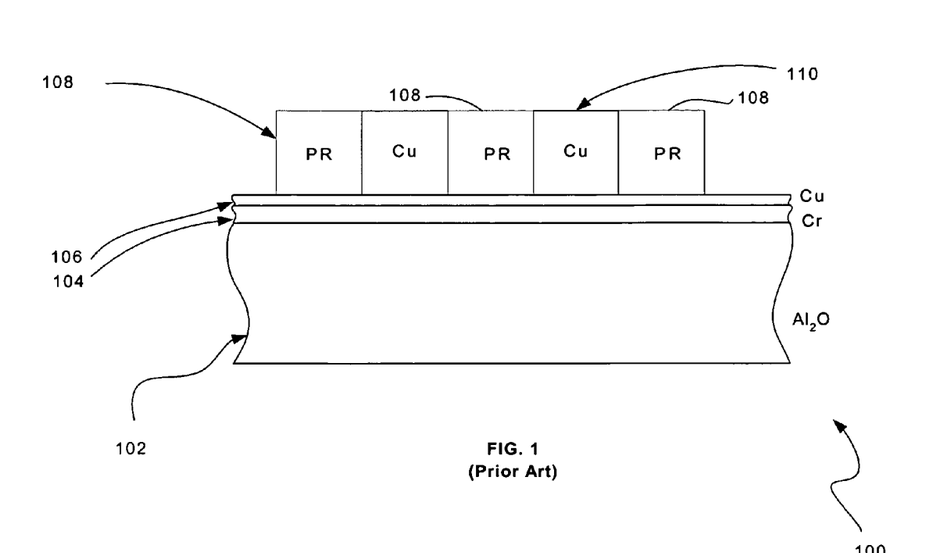
FIGS. 1-7 are cross section views of a prior art coil in various stages of manufacture.
Figure 2:
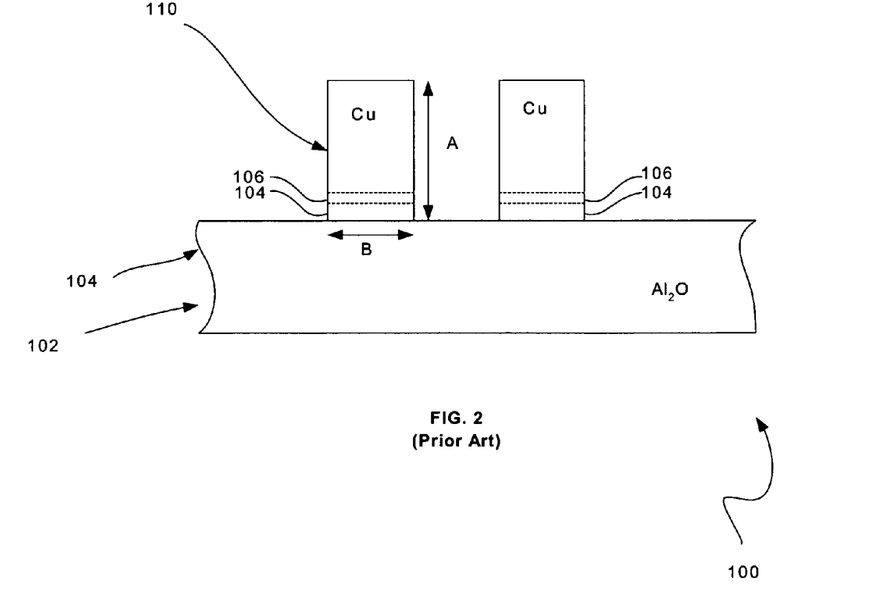

FIGS. 1-2 illustrate a method of manufacturing a coil structure associated with a magnetic head, in accordance with the prior art. FIG. 1 illustrates a cross-sectional view of an initial stack 100 with which a prior art coil structure may be manufactured. As shown, the stack 100 includes a first layer 102 including $Al_2O_3$ or some other substrate material. Deposited on the first layer 102 is an adhesion layer 104, which could be Cr or the like. A thin seed layer 106 is deposited on the second layer 104. The third layer 106 is constructed from a conductive material such as Cu or the like and can be deposited by sputtering.

On the third layer 106 is a fourth layer 108 including masked photoresist that defines a helical channel, 110, shown in cross section in FIG. 1. This channel 110, defines a coil structure. Deposited in the channels 110 is a conductive material 111 such as Cu or the like, which can be deposited by electroplating. After the conductive material layer 111 has been deposited, the photoresist can be removed and a material removal process or processes such as etching or ion milling can be used to remove any conductive material remaining between the turns of the coil.

The above processes result in a coil having a certain aspect ratio A/B. As will be appreciated by those skilled in the art, ever increasing data rate and data capacity requirements require ever increasing write fields from ever smaller write heads. The challenge therefore, in designing write coils is to increase the aspect ratio of the write head in order to increase the number of coil turns that can be fit into a given write head yoke. Ideally the spacing between turns of a coil should be minimized as much as possible while avoiding shorting between adjacent coils. In the above process, the photoresist defines the space between adjacent coils. However, photolithographic processes as well as the material properties of the photoresist, severely limit the amount by which this spacing can be reduced.

Figure 3:
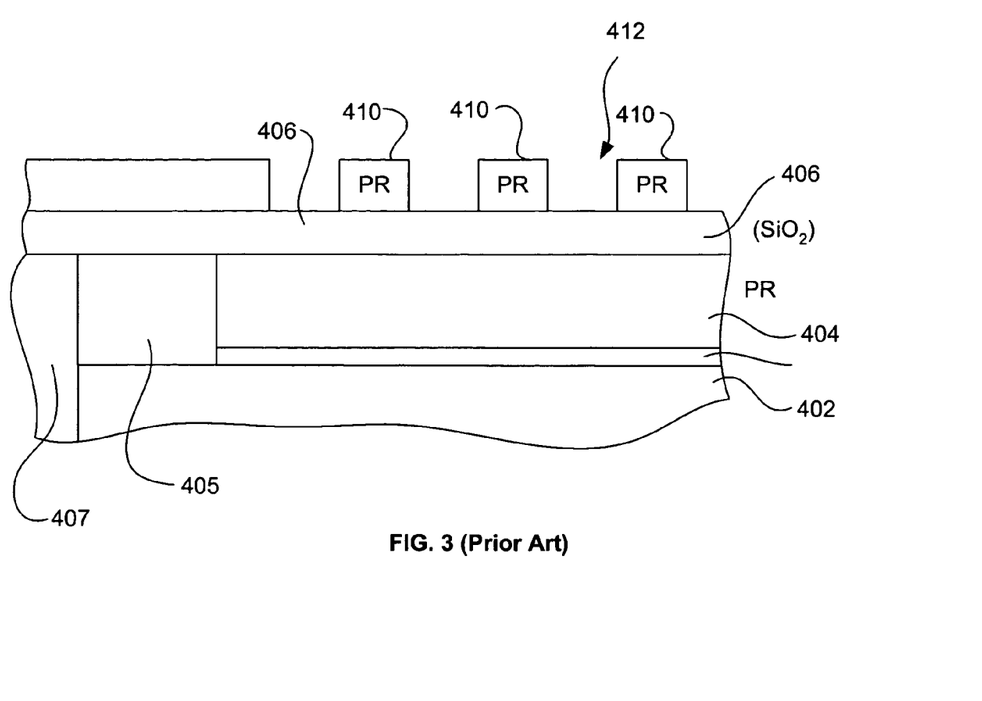
Figure 4:
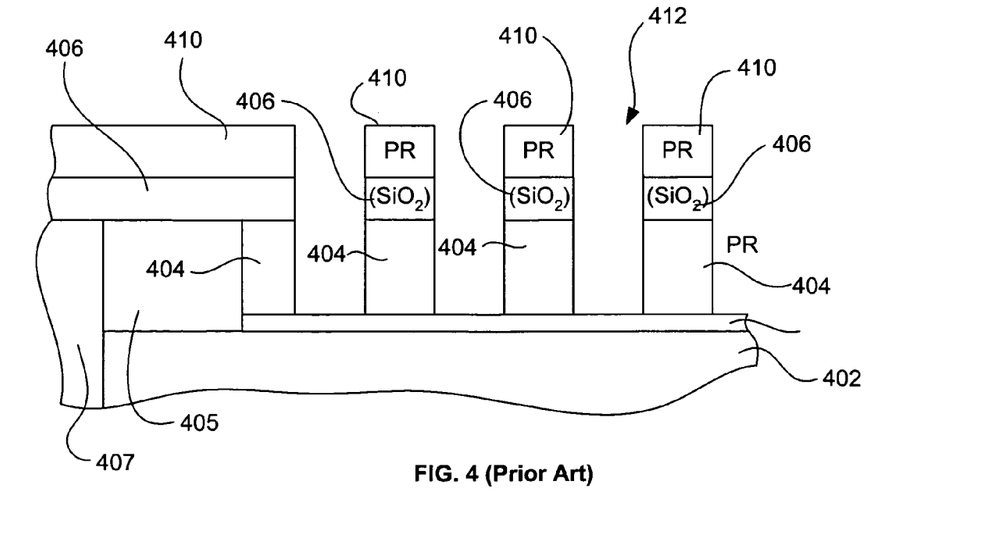

More recently, in an effort to minimize spacing between coils, a damascene process has been used to construct a coil having a smaller pitch than was previously possible using conventional processes. Such a damascene process is described in patent application U.S. 2003/0184912, filed April, 2002. With reference to FIGS. 3 and 4, a photoresist layer 404 is deposited on top of a substrate 402. Magnetic pedestal layers 405, and magnetic back gap (not shown) are formed adjacent to the coil structure to provide a portion of the magnetic pole and yoke structure for the write head, and can be constructed of, for example NiFe. An insulating fill material 407 such as alumina $Al_2O_3$ is deposited in the field area such adjacent beyond the pedestal, beyond the back gap (not shown) and into the plane of the paper (not shown). A hard mask 406, such as $SiO_2$ is deposited. Then a photoresist layer 410 is deposited and patterned to define the coil structure having multiple turns. With reference to FIG. 4, a reactive ion etching process is then performed to form a deep high aspect ratio channel 412.

Figure 5:
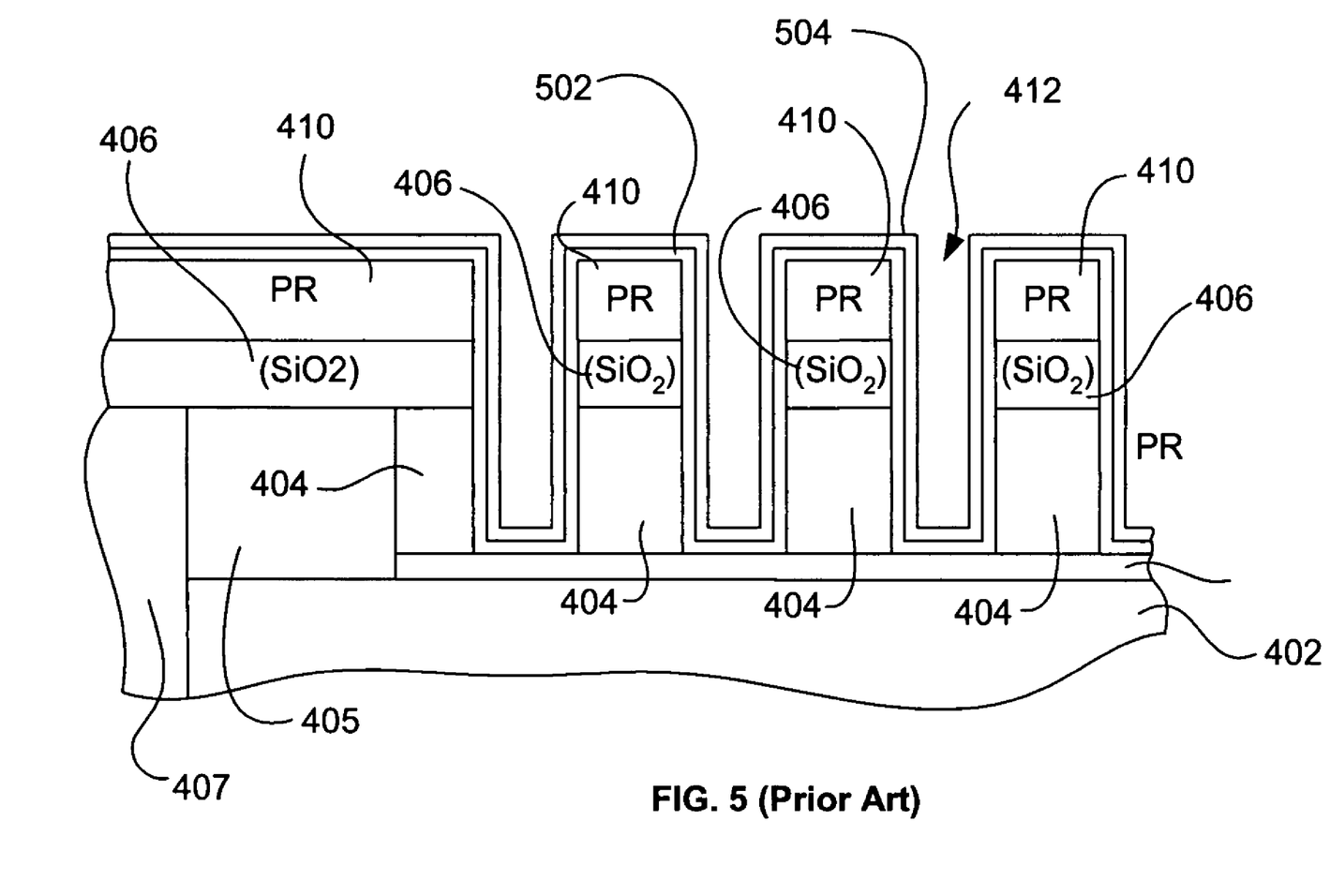
Figure 6:
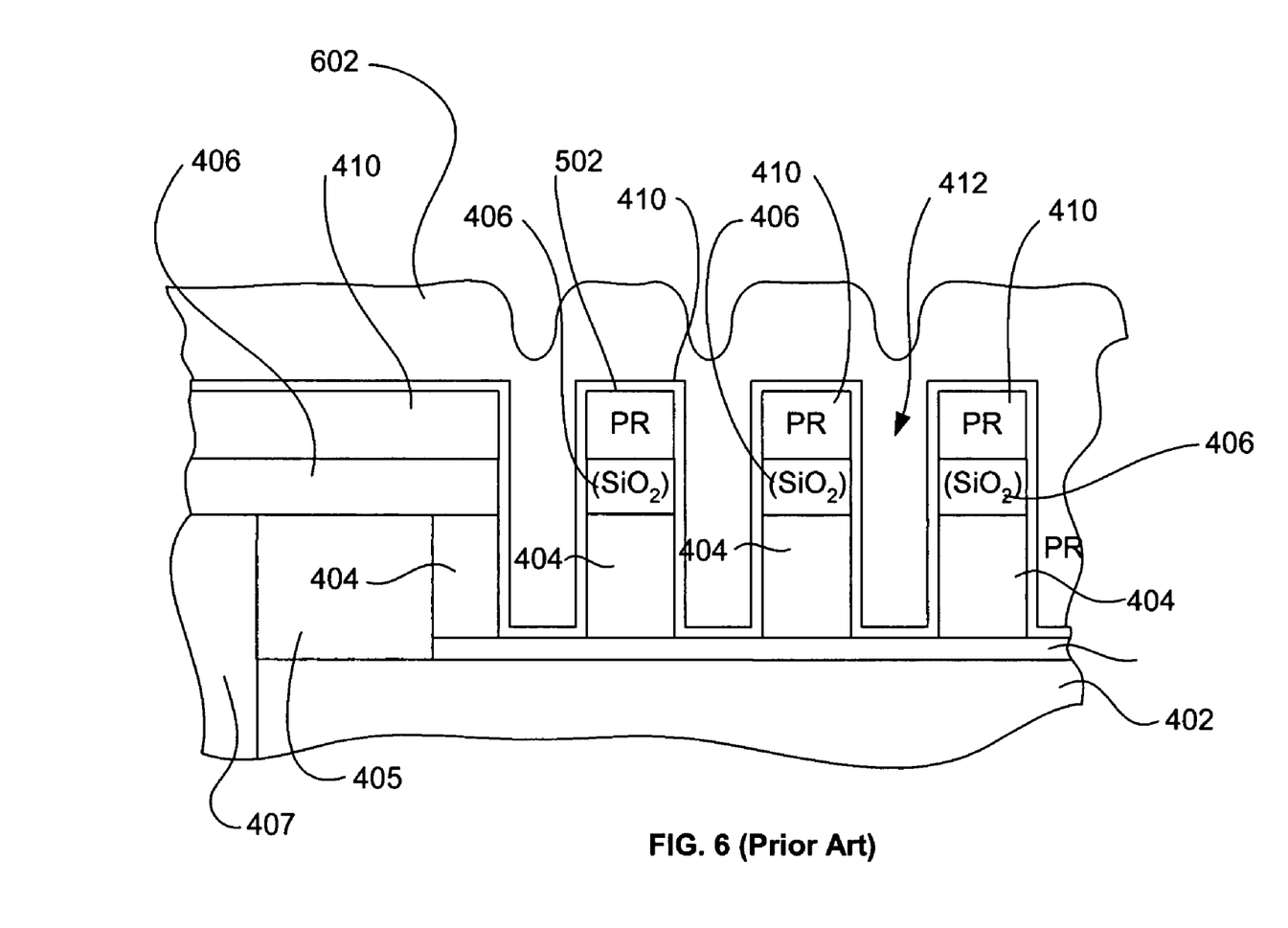

With reference now to FIG. 5, a Ta barrier layer 502 may then be deposited, followed by a Cu seed layer 504. Then, with reference to FIG. 6, Cu is electroplated 602, to completely fill the channels 412 and cover the previously deposited layers.

Figure 7:
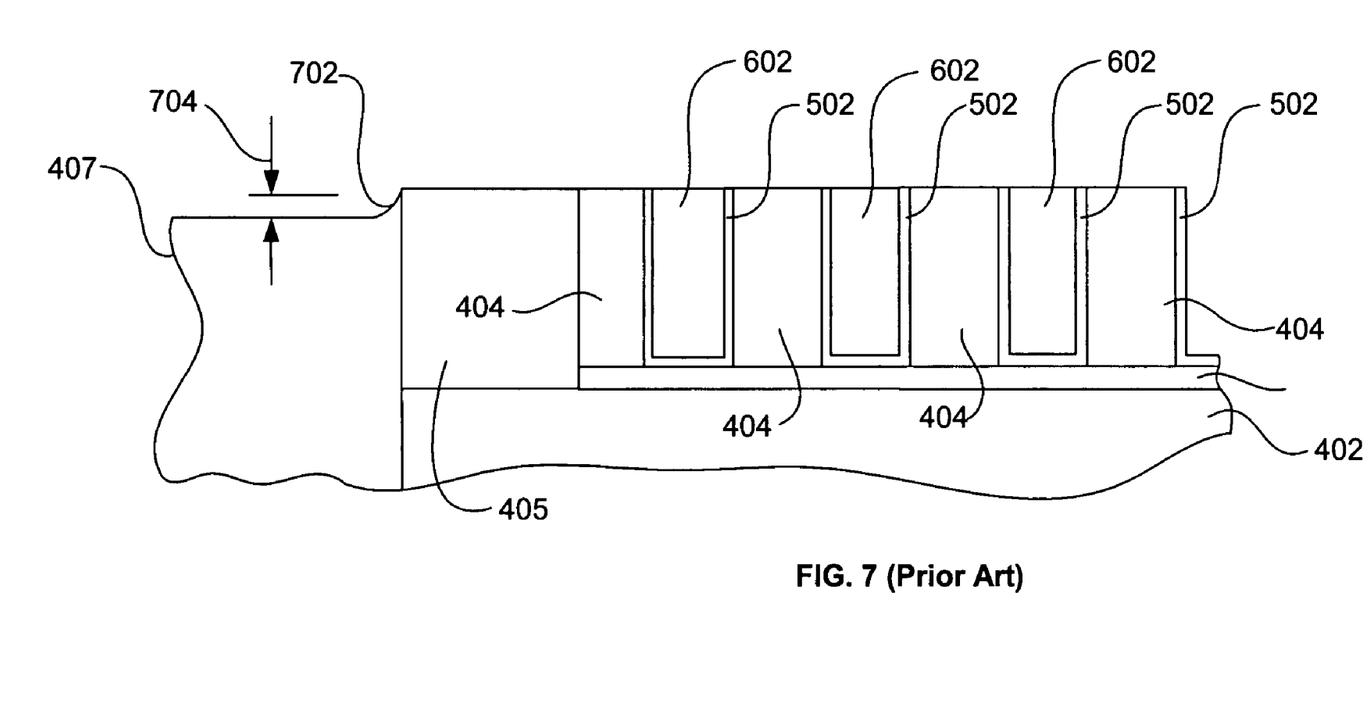

With reference now to FIG. 7, one or more CMP processes would then be desirable to remove upper portions of the copper 602, patterned photoresist 410, $SiO_2$ hard mask 406, Ta barrier layer 502 as well as the NiFe pole portions 405, and alumina $Al_2O_3$ fill material 407. However, previously available CMP processes remove the different materials at different rates. For example, such CMP processes remove alumina faster than the other deposited materials such as NiFe or Cu, leading to unacceptable recession 702 of the alumina. For example, such recession has typically caused a step height 704 of about 0.8-0.9 micrometers between the NiFe portions 405 and the Alumina fill 407. Furthermore, such CMP processes cause severe corrosion of the NiFe portions such as the pedestal 405 and back gap (not shown) as well as the coil 602. Because of these challenges previous attempts to commercialize such a damascene process have experienced limited success.

Therefore, there remains a need for a material removal process that can remove all of the above materials simultaneously, resulting in planar surface. Such a process would preferably consist of as few separate processing steps as possible and would not cause corrosion of any of the deposited layers.

SUMMARY OF THE INVENTION

The present invention provides a process for removing several materials including NiFe, $SiO_2$, Ta, photoresist, Cu and alumina at the same rate, making it possible to achieve a planar surface on a structure that includes all of these materials. Such a process includes a chemical mechanical polishing process using a slurry that includes, $SiO_2$, Ammonium Persulfate, and Benzotriazole BTA. The present invention can advantageously remove all of these materials simultaneously, while avoiding corrosion of the NiFe and of the Cu coil structure.

The chemical mechanical polishing process is useful in the manufacture of magnetic write elements, such as those used in magnetic disk drives. When a coil for such a write head is to be manufactured by a damascene process, a chemical mechanical polishing process is needed to remove many materials simultaneously at substantially the same material removal rate, while avoiding corrosion of the materials. The chemical mechanical polishing process provided by the present invention allows this.

Although the chemical mechanical polishing process is useful in the manufacture of magnetic write heads manufactured by a damascene process, it is also extremely beneficial for use in forming copper structures in other technical fields. Prior art methods used in fields such as seimiconductor processing require two CMP steps using two separate slurries. The first CMP removes a top layer of Cu, and a second removes other materials beneath the top layer of Cu. The present invention allows a single CMP process to be used, by removing several materials simultaneously and at substantially equal material removal rates.

BRIEF DESCRIPTION OF THE DRAWINGS

For a fuller understanding of the nature and advantages of this invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out this invention. This description is made for the purpose of illustrating the general principles of this invention and is not meant to limit the inventive concepts claimed herein.

Figure 8:
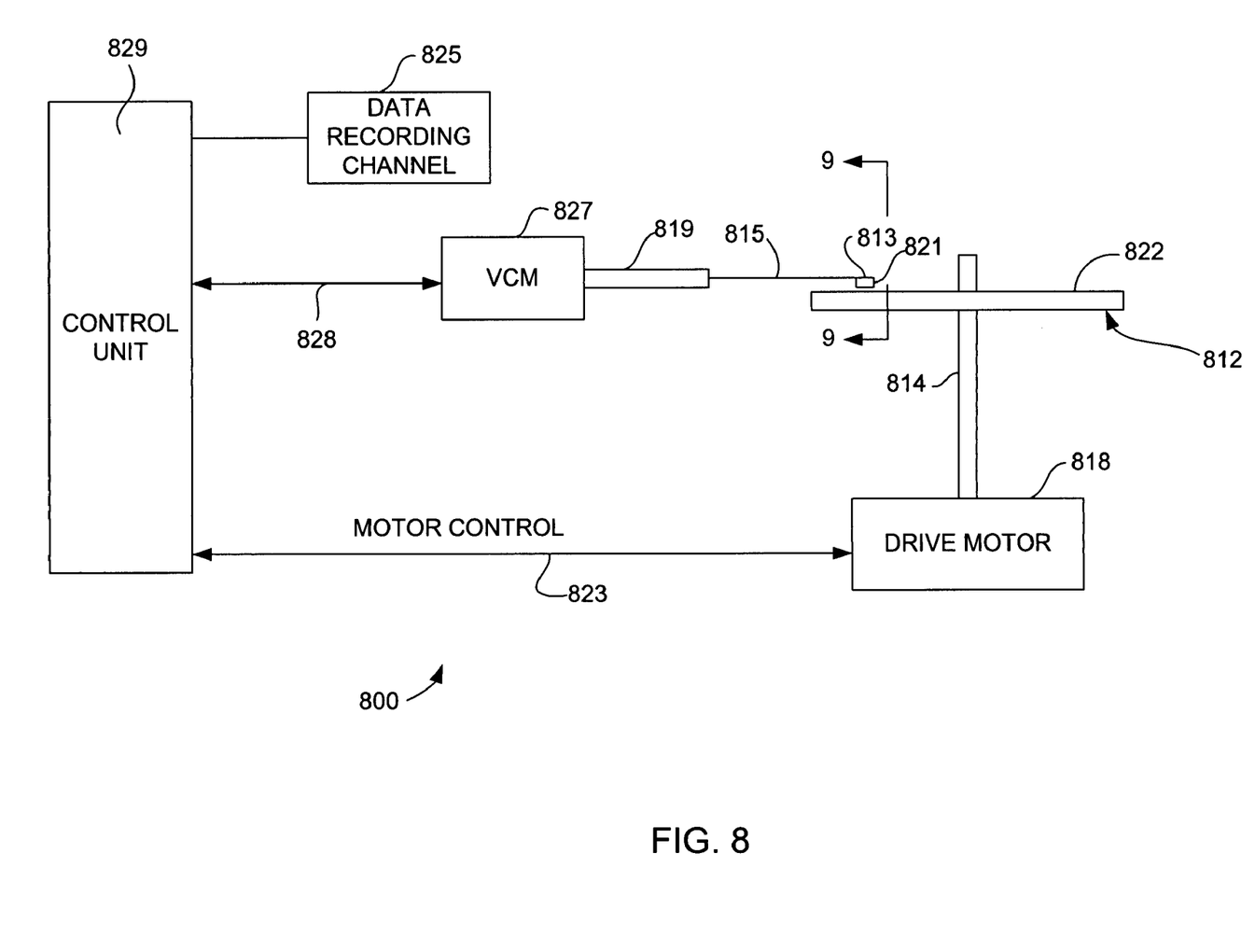
FIG. 8 is a schematic view of a magnetic data storage system according to an embodiment of the present invention.

Referring now to FIG. 8, there is shown a disk drive 800 embodying this invention. As shown in FIG. 8, at least one rotatable magnetic disk 812 is supported on a spindle 814 and rotated by a disk drive motor 818. The magnetic recording on each disk is in the form of an annular pattern of concentric data tracks (not shown) on the magnetic disk 812.

At least one slider 813 is positioned near the magnetic disk 812, each slider 813 supporting one or more magnetic head assemblies 821. As the magnetic disk rotates, the slider 813 is moved radially in and out over the disk surface 822 so that the magnetic head assembly 821 may access different tracks of the magnetic disk where desired data are written. Each slider 813 is attached to an actuator arm 819 by way of a suspension 815. The suspension 815 provides a slight spring force which biases slider 813 against the disk surface 822. Each actuator arm 819 is attached to an actuator means 827. The actuator means 827 as shown in FIG. 8 may be a voice coil motor (VCM). The VCM comprises a coil movable within a fixed magnetic field, the direction and speed of the coil movements being controlled by the motor current signals supplied by controller 829.

During operation of the disk storage system, the rotation of the magnetic disk 812 generates an air bearing between the slider 813 and the disk surface 822 which exerts an upward force or lift on the slider. The air bearing thus counter-balances the slight spring force of suspension 815 and supports slider 813 off and slightly above the disk surface by a small, substantially constant spacing during normal operation.

The various components of the disk storage system are controlled in operation by control signals generated by control unit 829, such as access control signals and internal clock signals. Typically, the control unit 829 comprises logic control circuits, storage means and a microprocessor. The control unit 829 generates control signals to control various system operations such as drive motor control signals on line 823 and head position and seek control signals on line 828. The control signals on line 828 provide the desired current profiles to optimally move and position slider 813 to the desired data track on disk 812. Write and read signals are communicated to and from write and read heads 821 by way of recording channel 825.

The above description of a typical magnetic disk storage system, and the accompanying illustration of FIG. 8 are for representation purposes only. It should be apparent that disk storage systems may contain a large number of disks and actuators, and each actuator may support a number of sliders.

Figure 9:
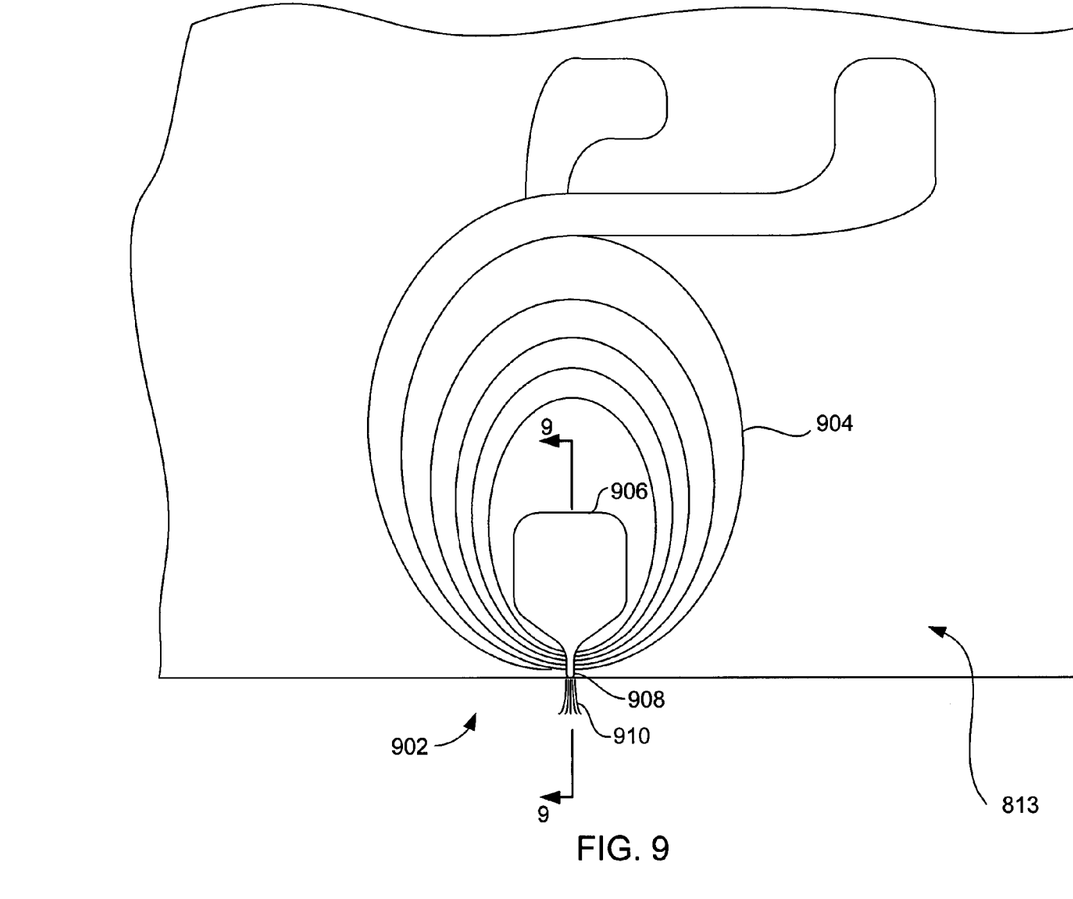
FIG. 9 is a view, taken from line 8-8 of FIG. 7, illustrating a plan view of a write element.

This invention provides a method of forming a write element. With reference to FIG. 9, a plan view of an exemplary write element 902, can be seen in relation to a slider 813. A coil 904, passing through a magnetic yoke 906, induces a magnetic flux in the yoke 906. The magnetic flux in the yoke 906, in turn causes a magnetic field to fringe out at the pole tip 908. It is this fringing field 910 that writes magnetic signals onto a nearby magnetic medium. It will be appreciated that the strength of the signal depends essentially upon two factors, the number of coil turns passing through the yoke 906, and the amount of current passing through the coil 904. The amount of current that can be passed through the coil 904, however, is limited by the cross section of the coil turns, since a smaller cross section will lead to increased resistance and thereby increased heat generation. It will, therefore, be appreciated that optimal performance depends upon increased coil pitch (ie. the number of coil turns per inch), such that minimal spacing between coil turns can be achieved while maintaining electrical isolation of the turns, and also on maximizing aspect ratio, which is defined as the ratio of the height of a coil turn (out of the page) to the width of the coil turn.

Figure 14:
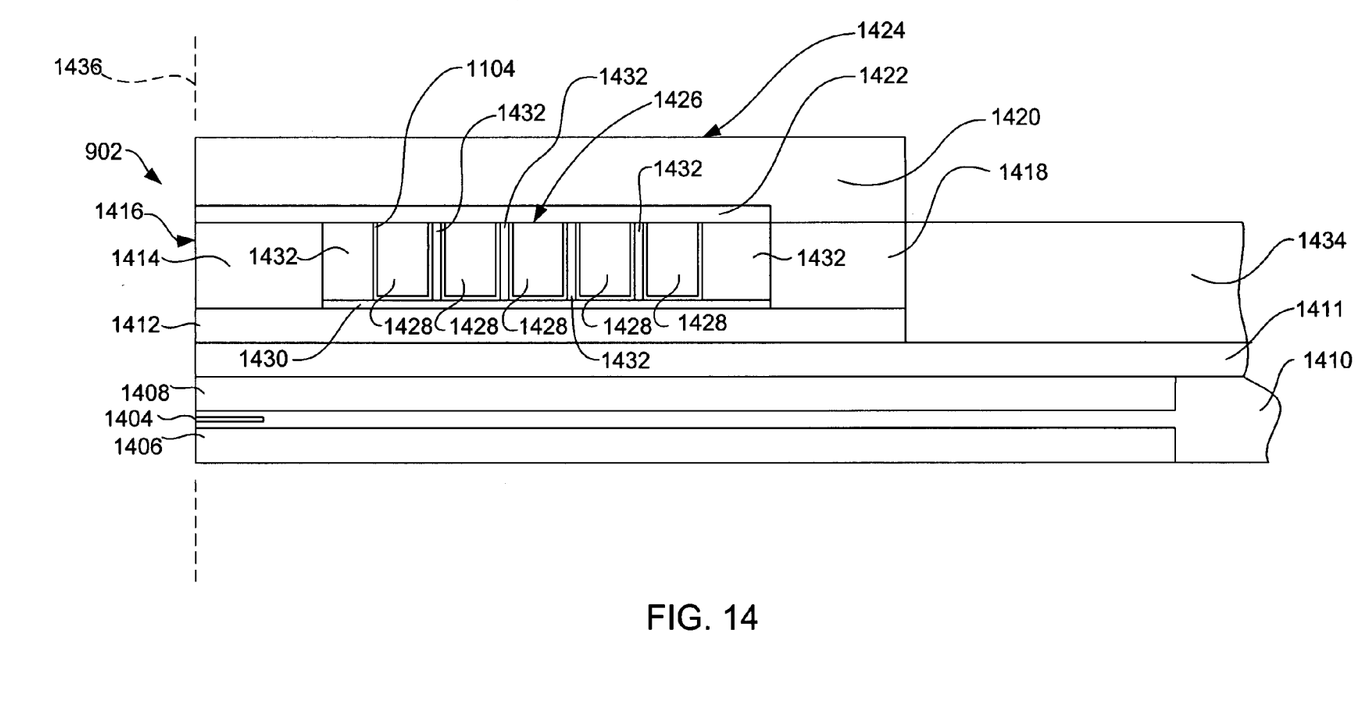
FIG. 14 is a cross sectional view illustrating a write head constructed according to an embodiment of the present invention.

FIG. 14 illustrates an embodiment of a magnetic head 1402 including a magnetoresistive sensor 1404 sandwiched between first and second magnetic shields 1406 1408 and embedded in a dielectric material 1410 such as alumina. The magnetic head 1402 also includes a magnetic write element 902 constructed according to the present invention and formed above the sensor 1404 and shields 1406, 1408.

The write element 902 is constructed on a substrate 1411, which can be for example alumina ($Al_2O_3$). A first magnetic pole 1412 is formed over the substrate 1410. The fist pole 1412 is formed of a magnetic material such as for example NiFe and can be formed by electroplating. A magnetic pedestal 1414 can be formed on the first pole 1412 in a pole tip region 1416. A magnetic back gap 1418 extends from the first pole 1412 to a second pole 1420 in a region opposite the pole tip region 1416. The first and second poles 1412,1420 are magnetically connected by the back gap 1418, but are magnetically separated in the pole tip region 1416, by a write gap provided by a write gap layer 1422. The write gap layer 1422 can be formed of many non-magnetic materials such as for example, alumina. The first and second poles 1412, 1420 form a magnetic yoke 1424. An electrically conductive coil 1426 having a plurality of turns 1428 passing through the yoke 1424 is separated from the first pole 1412 by an insulation layer 1430, which can be for example, alumina. The turns 1428 of the coil 1426 are insulated from one another and from the pedestal 1414 and back gap 1418 by a dielectric material 1432 such as hard baked photoresist. An alumina fill 1434 is provided in the area outside of the yoke, termed the "field area".

Figure 10:
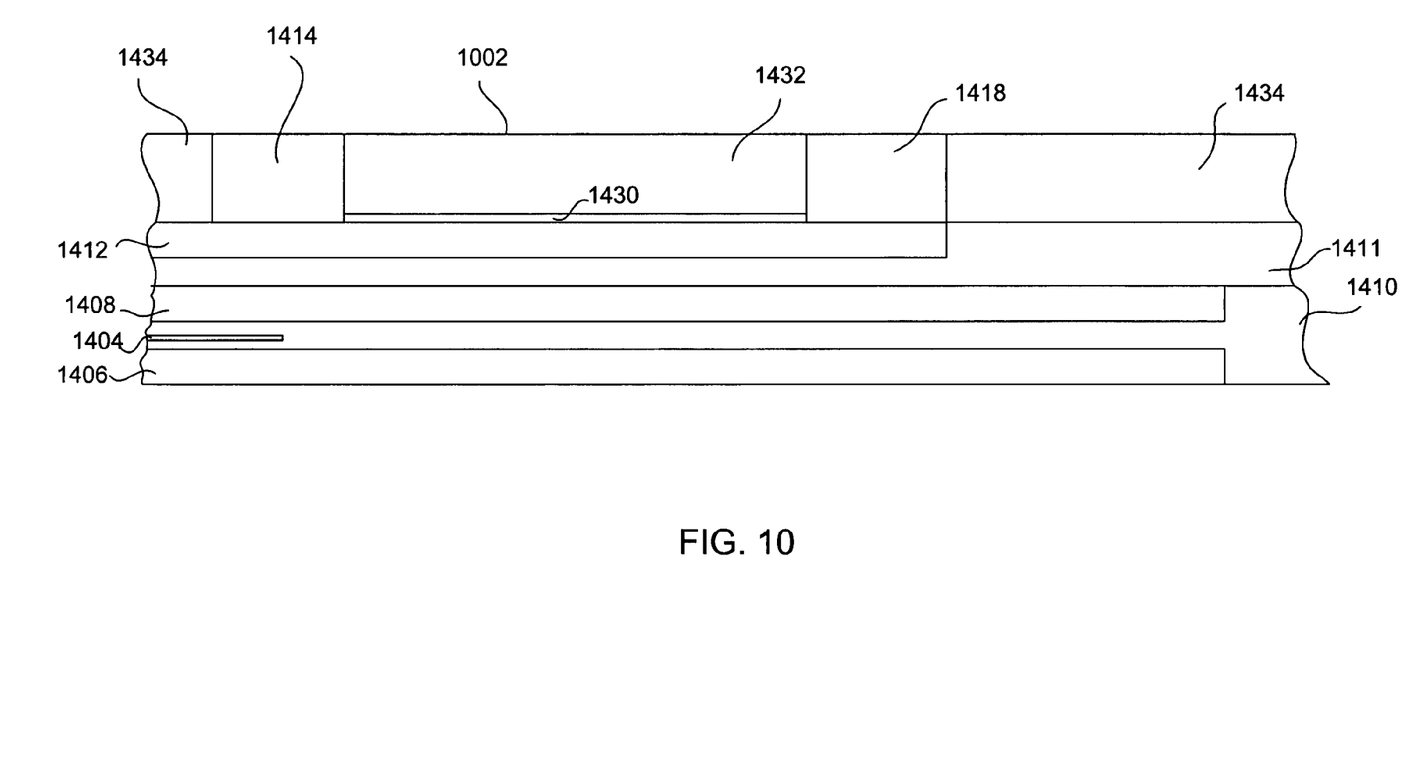
FIGS. 10-13 are cross sectional views of a write head in various stages of manufacture.

With reference now to FIG. 10, a damascene process for manufacturing a write coil is described. The read sensor 1404 and first and second magnetic shields 1406, 1408 are provided, according to methods familiar to those skilled in the art. The alumina ($Al_2O_3$) insulation 1410 fills field region and regions between the shields 1406, 1408. The first magnetic pole 1412 is then formed above the second shield 1408, and separated there from by another alumina insulation layer 1411. The pedestal 1414, and back gap 1418 are formed over the first pole 1412, and are constructed of a magnetic material such as NiFe, which can be deposited by electroplating. A thin layer of alumina 1430 is formed over the first pole 1412 in the region between the pedestal 1414 and back gap 1418. Photoresist 1432 is deposited over the alumina layer 1430 and hard baked. Another alumina fill material 1434 is deposited in the field regions, including the regions beyond the pedestal 1414, back gap 1418 and in other field regions not shown, such as into the plane of the paper. A chemical mechanical polishing process can then be employed to form a planar surface 1002.

Figure 11:
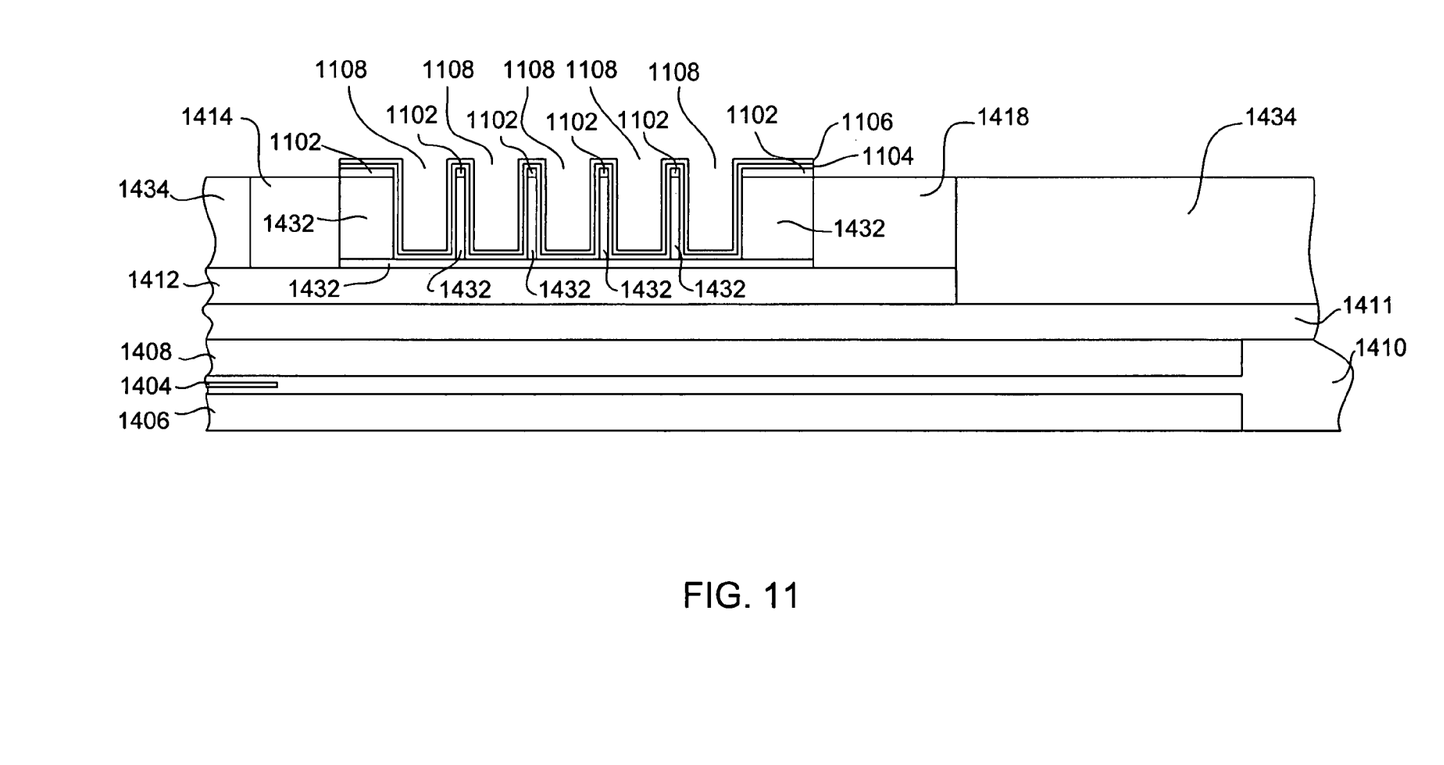
Figure 12:
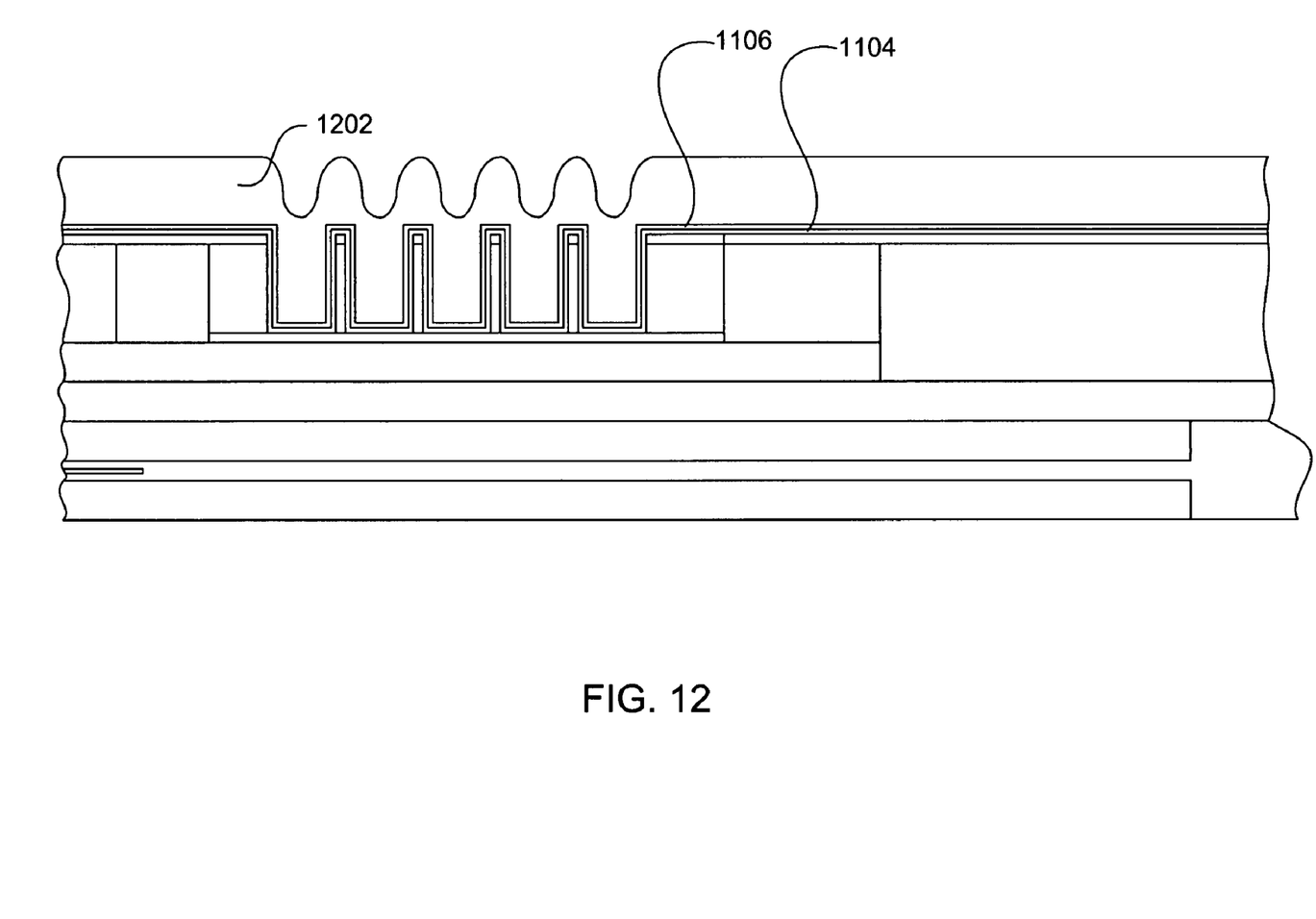

With reference now to FIG. 11, a thin hard mask 1102, such as for example $SiO_2$ is deposited and patterned to define a coil. Thereafter a material removal process, such as for example reactive ion etch (RIE) is performed to remove selected portions of the hard baked photoresist, 1432 forming a multi-turn, coil defining channel 1108. A layer of Ta 1104 is then deposited followed by a Cu seed layer 1106. The Ta and Cu can be deposited by, for example, sputtering. The Ta 1104 acts as a diffusion barrier to prevent Cu from being absorbed into the other materials, and also acts as an adhesion layer. The Cu seed 1106 allows for electroplating. With reference now to FIG. 12, Cu 1202 is deposited by electroplating over the Cu seed layer 1106. It will be appreciated that the Cu seed 1106, provides an electrically conductive surface on which to electroplate the Cu layer 1202.

Figure 13:
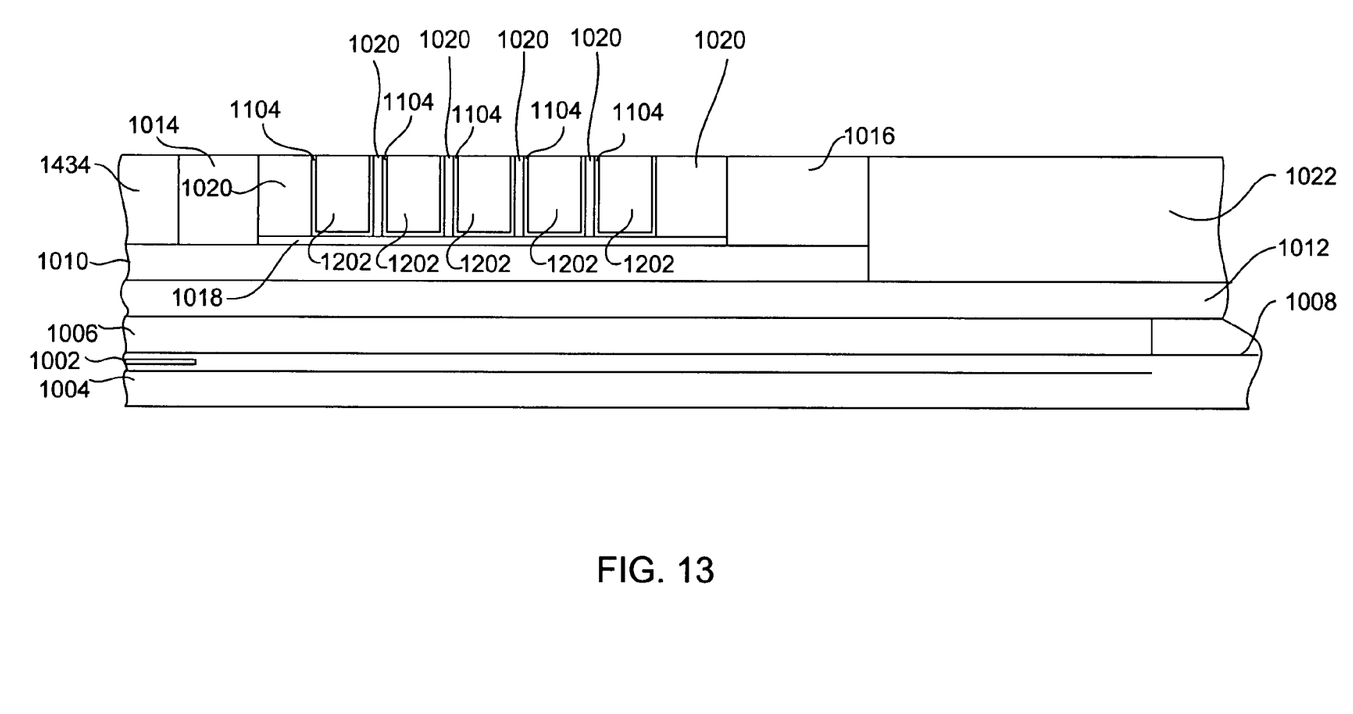

With reference now to FIG. 13, an innovative chemical mechanical polishing (CMP) process is performed to remove selected portions of the Cu 1202, 1106 (FIG. 12), Ta 1104, $SiO_2$ hard mask 1102 (FIG. 12), hard baked resist 1432, Alumina 1434, and NiFe back gap 1418 and pedestals 1414. This innovative CMP process advantageously removes all 6 of these materials simultaneously at the substantially same material removal rates. The CMP process of the present invention utilizes a slurry containing $SiO_2$, Benzotriazole (BTA), and ammonium persulfate (($NH_4$)$_2S_2O_8$) (APS). The $SiO_2$ provides a polishing abrasive.

Referring again to FIG. 14, with the desired high pitch, high aspect ratio coil 1432 formed, the write gap layer 1422, and second pole 1420 can be formed by photolithographic and deposition processes familiar to those skilled in the art. Thereafter, a lapping process is performed to remove material from the pole tip region 1416, to a desired ABS location 1436.

Ammonium persulfate (APS) promotes Cu removal, $2NH^{4+}$ is a complexing agent for Cu removal rate control. Previously used slurries removed alumina faster than Cu leading to alumina recession. The addition of ammonium persulfate increases Cu removal rate without appreciably affecting the removal rate of alumina. Furthermore, the removal rate of Cu is proportional to the concentration of ammonium persulfate. Therefore, the concentration of ammonium persulfate can be adjusted to achieve a desired Cu removal rate, and the step height between the Cu coil and the alumina can be minimized.

The presence of ammonium persulfate in the slurry also promotes the removal of NiFe. $S_2O_8^{2-}$ from APS is an oxidizer for NiFe removal rate control. Whereas previously used CMP processes removed alumina faster than NiFe causing alumina recession, the concentration of APS in the CMP slurry of the present invention can be adjusted to achieve planarity between NiFe and alumina. While the addition of APS in the slurry leaves the removal rate of alumina substantially unaffected, increased concentration increases NiFe removal until a certain concentration is reached at which point NiFe removal rate decreases with increased APS concentration.

The $SiO_2$ in the slurry effectively removes the $SiO_2$ hard mask and Ta diffusion barrier. The addition of Benzotriazole (BTA) prevents corrosion of NiFe and Cu. Whereas significant corrosion of either NiFe or Cu had been experienced when using previously available CMP processes, the CMP process of the present invention advantageously avoids such corrosion very significantly. By variation of abrasive concentration, oxidant concentration and corrosion inhibitor concentration the inventors succeeded in adjusting the polishing rate of Copper, Ta, SiO2, HB resist, NiFe, and alumina, attaining a planar and corrosion free surface in a single step copper damascene CMP.

Figure 15:
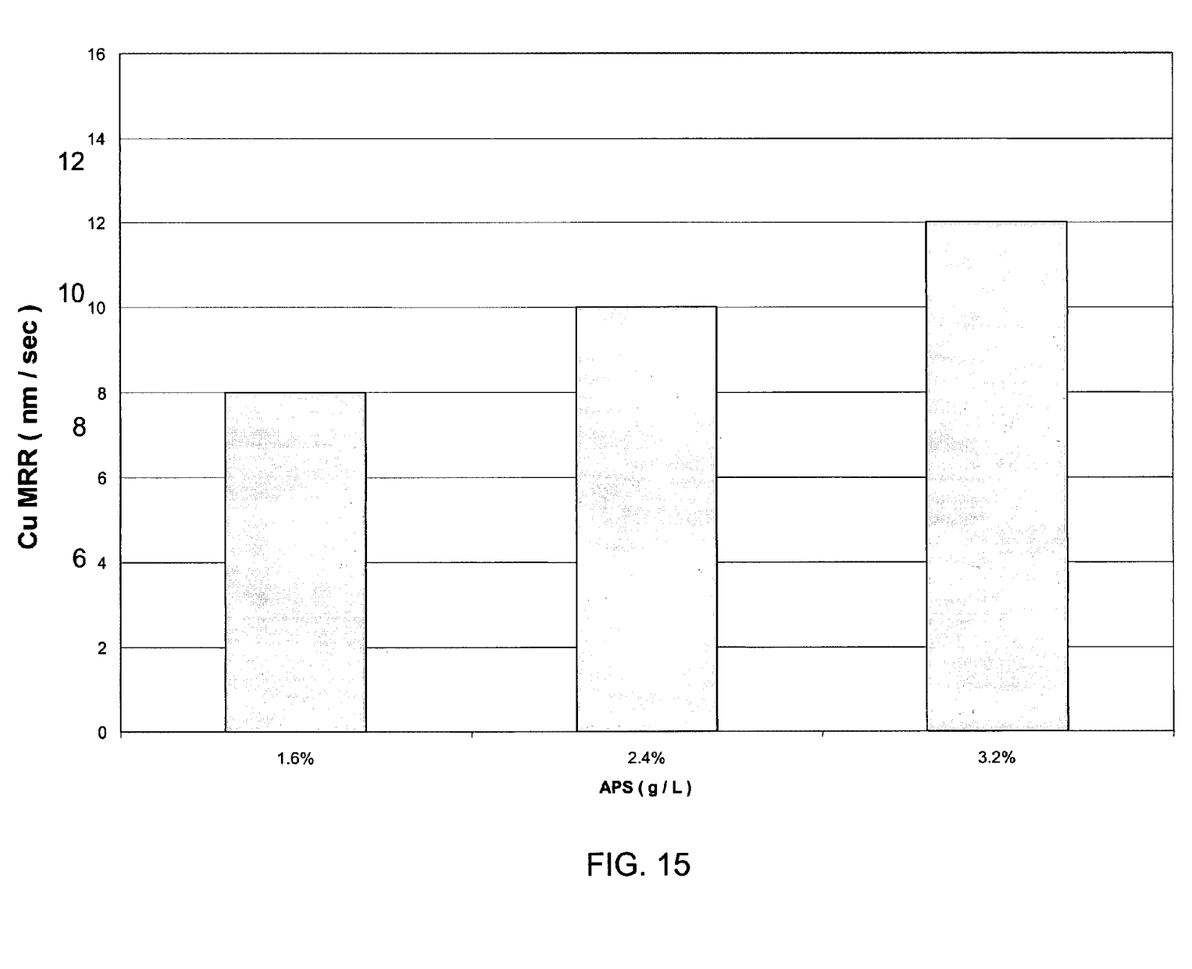
FIGS. 15-17 graphically illustrate the effect of a CMP process according to the present invention on material removal rates.
Figure 16:
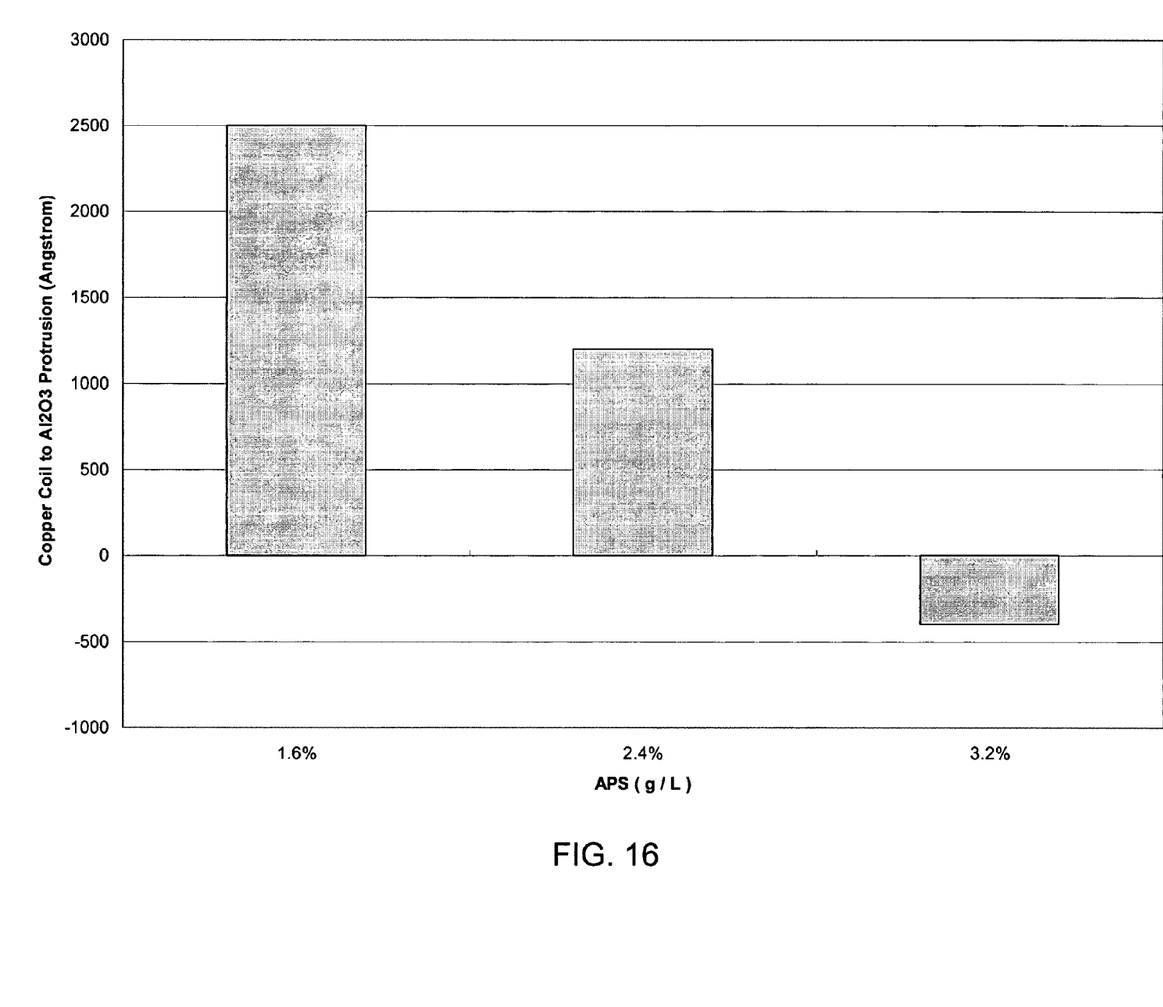
Figure 17:
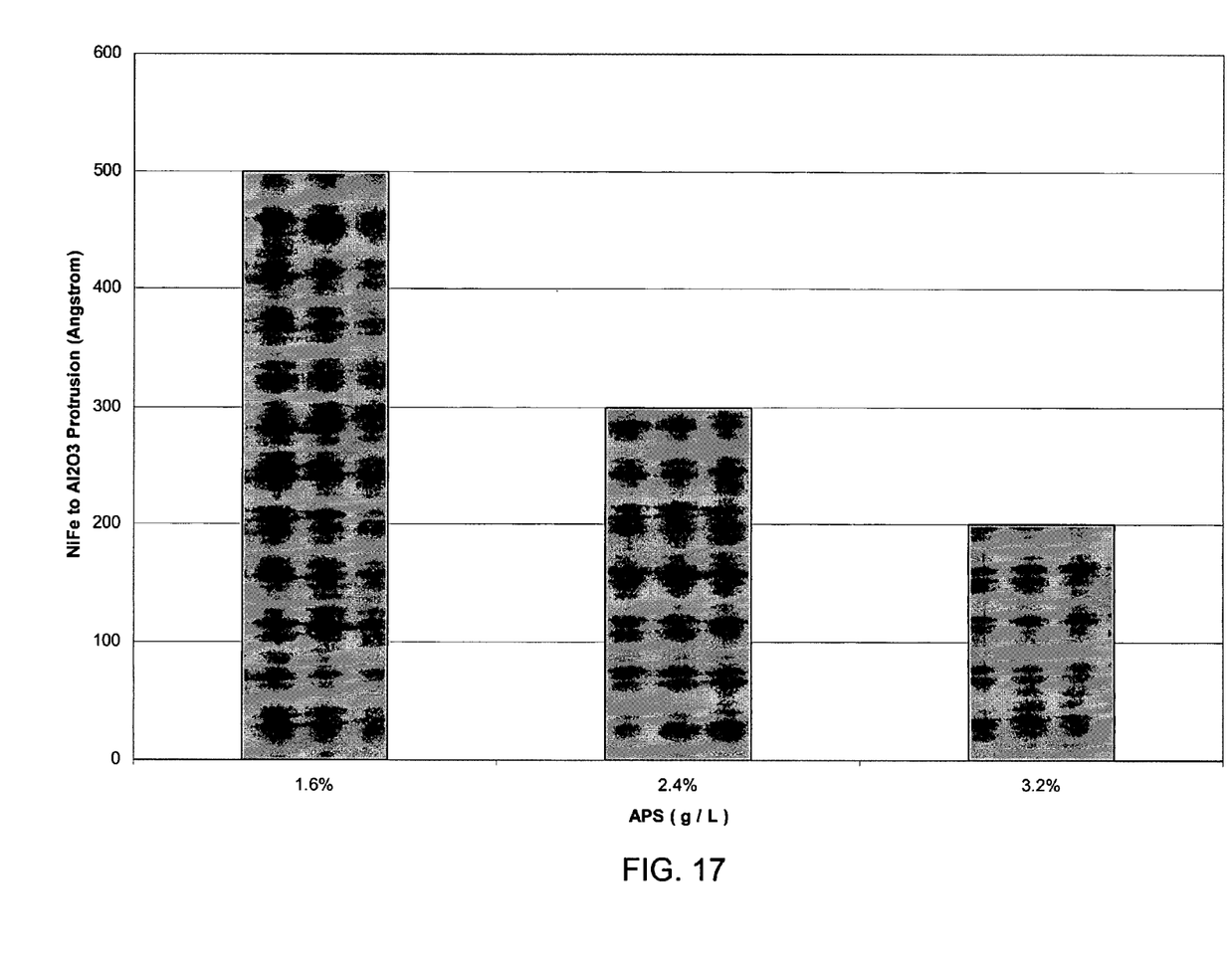

FIG. 15 illustrates the relationship between APS concentration and the material removal rate (MRR) of Cu. It can be seen that the material removal rate of Cu is directly proportional to the concentration (grams per liter) of APS in the slurry. With reference to FIG. 16, it can be seen that the recession rate between $Al_2O_3$ and Cu is directly proportional to the concentration of APS in the slurry, the recession being negligible at roughly 3 grams per liter. With reference now to FIG. 17, the relationship between APS concentration and $Al_2O_3$/NiFe recession can be seen. As can be seen, the protrusion of NiFe from the $Al_2O_3$ decreases with increasing APS concentration. While a CMP process embodying the present invention has been described with reference to the construction of a write head for use in a magnetic recording system, it should be appreciated that the CMP process can be advantageously employed in other fields utilizing Cu damascene processes. Such Cu damascene processes include those used in the semiconductor industry. For example, in the semiconductor industry, previously available manufacturing processes required two separate CMP steps in two separate slurries. The first step was used to remove an upper Cu layer, and a second was needed to remove remaining materials. Furthermore, when used to construct a write head, the present invention should not be construed as limited to write heads used in disk drives. For example, a write head manufactured according to the present invention could also be used in a tape drive or other magnetic memory system.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for forming a Cu coil for use in a magnetic head, comprising:

Forming a magnetic pole structure;

depositing a photoresist;
depositing a hard mask;
patterning said hard mask to define a coil pattern;
performing a material removal process to form at least one trench according to said coil pattern;
depositing Ta
depositing Cu; and
performing a chemical mechanical polishing (CMP) process using a slurry comprising:

Ammonium Persulfate, Benzotriazole (BTA), and $SiO_2$; and adjusting a ratio of Ammonium Persulfate and Benzotriazole (BTA) so that said CMP process removes material from said photoresist, hard mask, Ta, and Cu at the same rate.

* * * * *